US012666671B2

(12) United States Patent
Baba et al.

(10) Patent No.: US 12,666,671 B2
(45) Date of Patent: Jun. 23, 2026

(54) SEMICONDUCTOR DEVICE AND METHOD FOR MANUFACTURING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shotaro Baba, Kawasaki (JP); Tomoaki Inokuchi, Yokohama (JP); Tatsuo Shimizu, Tokyo (JP); Tatsuya Nishiwaki, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 310 days.

(21) Appl. No.: 18/449,895

(22) Filed: Aug. 15, 2023

(65) Prior Publication Data

US 2024/0194739 A1     Jun. 13, 2024

(30) Foreign Application Priority Data

Dec. 13, 2022     (JP) ................................. 2022-198536

(51) Int. Cl.
*H10D 62/13* (2025.01)
*H10D 30/01* (2025.01)
(Continued)

(52) U.S. Cl.
CPC ......... *H10D 62/161* (2025.01); *H10D 30/061* (2025.01); *H10D 62/83* (2025.01); *H10D 64/64* (2025.01); *H10D 64/647* (2025.01)

(58) Field of Classification Search
CPC .... H10D 62/161; H10D 30/061; H10D 62/83; H10D 64/64; H10D 64/647;
(Continued)

(56) References Cited

U.S. PATENT DOCUMENTS 9,716,009 B2     7/2017   Kobayashi et al.
2011/0291186 A1*  12/2011  Yilmaz ................ H10D 30/668
                                            257/334
(Continued)

FOREIGN PATENT DOCUMENTS

JP          2008536316 A     9/2008
JP          2014187141 A     10/2014
(Continued)

OTHER PUBLICATIONS

Office Action issued on May 11, 2026, in corresponding Japanese Application No. 2022-198536, 18 pages.

*Primary Examiner* — Syed I Gheyas
(74) *Attorney, Agent, or Firm* — Maier & Maier, PLLC

(57) ABSTRACT
According to one embodiment, a semiconductor device include first to third electrode, a semiconductor member, a first conductive member, and a first insulating member. A second insulating region of the first insulating member includes a first face facing the third partial region of the first semiconductor region. The third insulating region of the first insulating member includes a second face facing the third partial region of the first semiconductor region. The first face includes a first end on a side of the first electrode in the first direction. The second face includes a second end on a side of the second electrode in the first direction. A second position of the second end in the second direction is different from a first position of the first end in the second direction.

15 Claims, 8 Drawing Sheets

(51) Int. Cl.
    *H10D 62/83*        (2025.01)
    *H10D 64/64*        (2025.01)

(58) Field of Classification Search
    CPC .. H10D 62/8503; H10D 64/117; H10D 64/23;
               H10D 30/025; H10D 30/63; H10D
                                    64/513
    See application file for complete search history.

(56) References Cited

U.S. PATENT DOCUMENTS

| | | | | |
|---|---|---|---|---|
| 2012/0056262 A1* | 3/2012 | Saito | .................... | H10D 64/647 |
| | | | | 257/330 |
| 2012/0061753 A1* | 3/2012 | Nishiwaki | ............ | H10D 30/668 |
| | | | | 257/E29.264 |
| 2012/0241854 A1* | 9/2012 | Ohta | .................... | H10D 62/154 |
| | | | | 438/270 |
| 2013/0056790 A1* | 3/2013 | Kawamura | ........ | H10D 30/0295 |
| | | | | 257/E29.198 |
| 2013/0334598 A1* | 12/2013 | Okumura | ........... | H10D 30/0297 |
| | | | | 438/270 |
| 2014/0284711 A1 | 9/2014 | Katoh et al. | | |
| 2016/0093719 A1 | 3/2016 | Kobayashi et al. | | |
| 2021/0257469 A1 | 8/2021 | Inokuchi et al. | | |

FOREIGN PATENT DOCUMENTS

| | | | |
|---|---|---|---|
| JP | 2016072482 A | 5/2016 |
| JP | 6203697 B2 | 9/2017 |
| JP | 2021132195 A | 9/2021 |

* cited by examiner

FIG. 5A
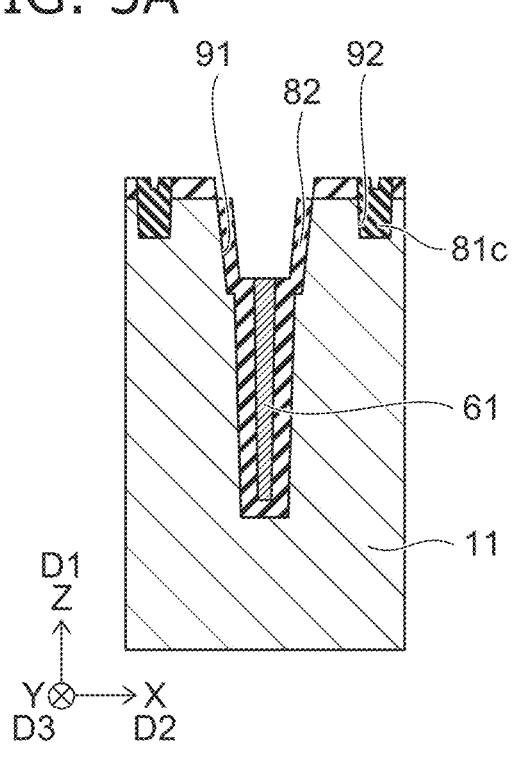
FIG. 5B
FIG. 5C
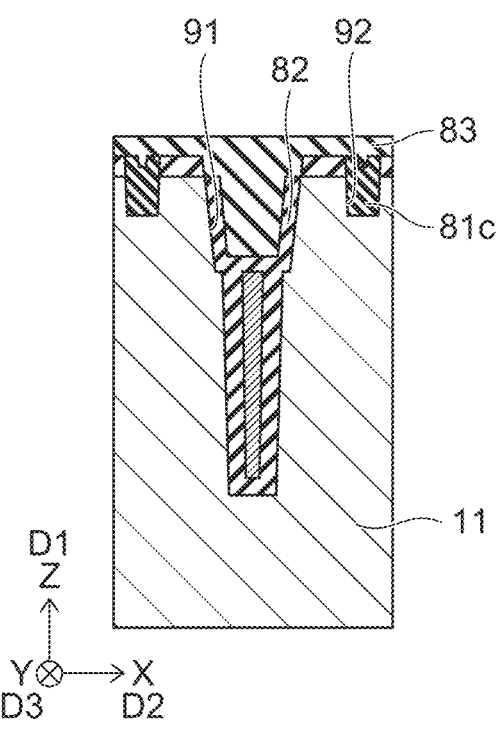
FIG. 5D
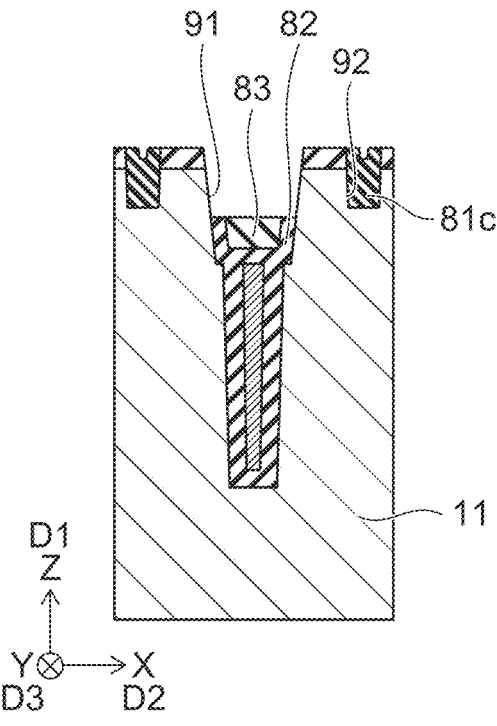

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent No. 2022-198536, filed on Dec. 13, 2022; the entire contents of which are incorporated herein by reference.

FIELD

Embodiments of the invention generally relate to a semiconductor device and a method for manufacturing the same.

BACKGROUND

For example, in semiconductor devices, stable characteristics are desired.

BRIEF DESCRIPTION OF THE DRAWINGS

FIGS. 5A to 5D are schematic cross-sectional views illustrating the method for manufacturing the semiconductor device according to the second embodiment;

DETAILED DESCRIPTION

Figure 1:
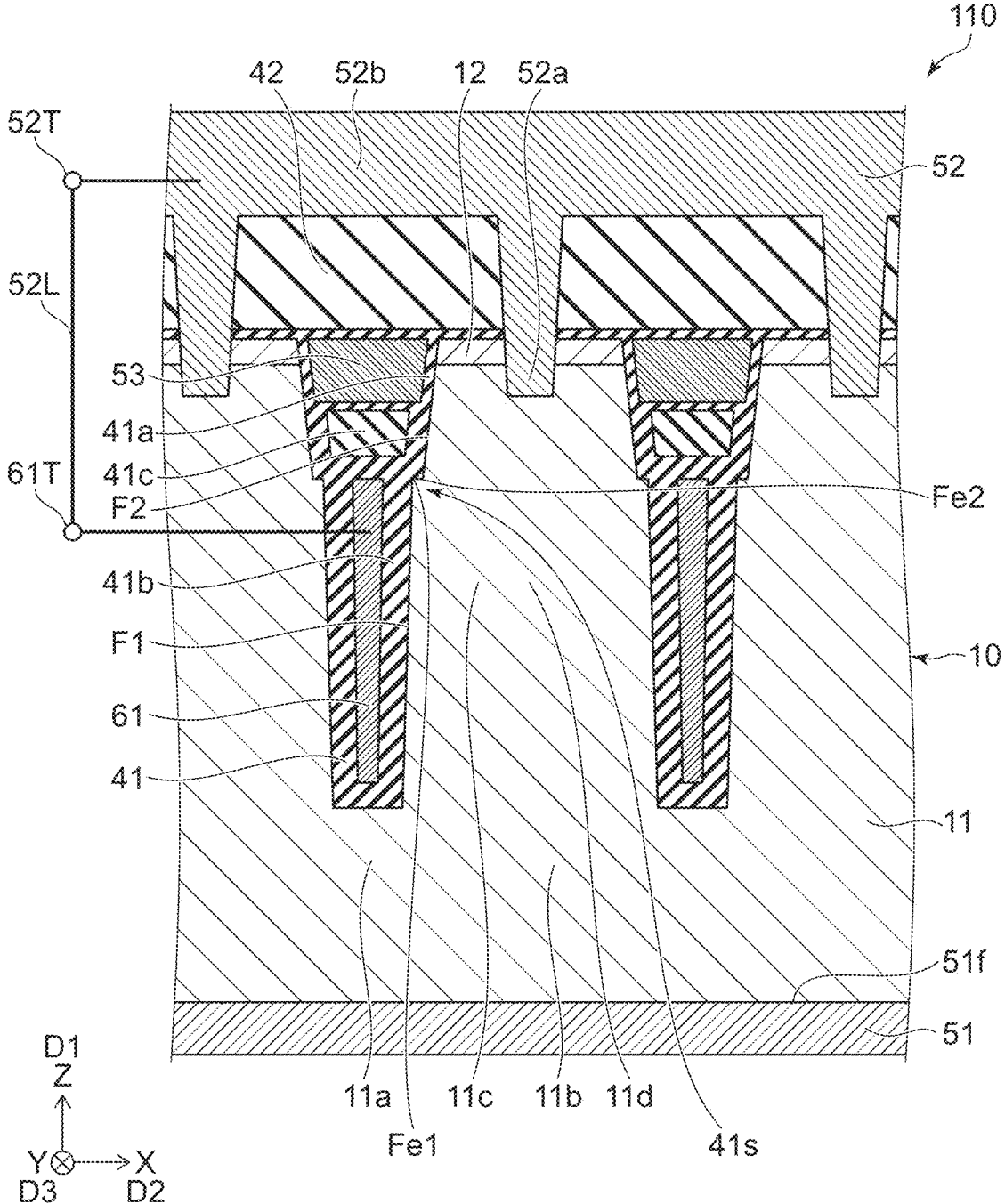
FIG. 1 is a schematic cross-sectional view illustrating a semiconductor device according to a first embodiment.

According to one embodiment, a semiconductor device include a first electrode, a second electrode, a third electrode, a semiconductor member, a first conductive member, and a first insulating member. A direction from the first electrode to the second electrode is along a first direction. The second electrode including a first electrode portion and a second electrode portion connected to the first electrode portion. The third electrode is provided between the first electrode and the second electrode portion. The semiconductor member includes a first semiconductor region of a first conductive type, and a second semiconductor region of the first conductive type. The first semiconductor region includes a first partial region, a second partial region, a third partial region and a fourth partial region. The first partial region is provided between the first electrode and the third electrode in the first direction. A second direction from the first partial region to the second partial region crosses the first direction. A position of the third partial region in the second direction is between a position of the first partial region in the second direction and a position of the second partial region in the second direction. The fourth partial region is provided between the second partial region and the first electrode. An impurity concentration of the first conductive type in the second semiconductor region is higher than an impurity concentration of the first conductive type in the first semiconductor region. The second semiconductor region is provided between the third electrode and the first electrode portion in the second direction. The second semiconductor region is provided between the third partial region and the second electrode portion in the first direction. The first conductive member is provided between the first partial region and the third electrode in the first direction. A direction from the first conductive member to the fourth partial region is along the second direction. The first conductive member is electrically connected to the second electrode or is configured to be electrically connected to the second electrode. The first insulating member includes a first insulating region, a second insulating region, and a third insulating region. The first insulating region is provided between the third electrode and the second semiconductor region. The second insulating region is provided between the semiconductor member and the first conductive member. At least a part of the third insulating region is provided between the first conductive member and the third electrode. The second insulating region includes a first face facing the third partial region. The third insulating region includes a second face facing the third partial region. The first face includes a first end on a side of the first electrode in the first direction. The second face includes a second end on a side of the second electrode in the first direction. A second position of the second end in the second direction is different from a first position of the first end in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

Figure 2:
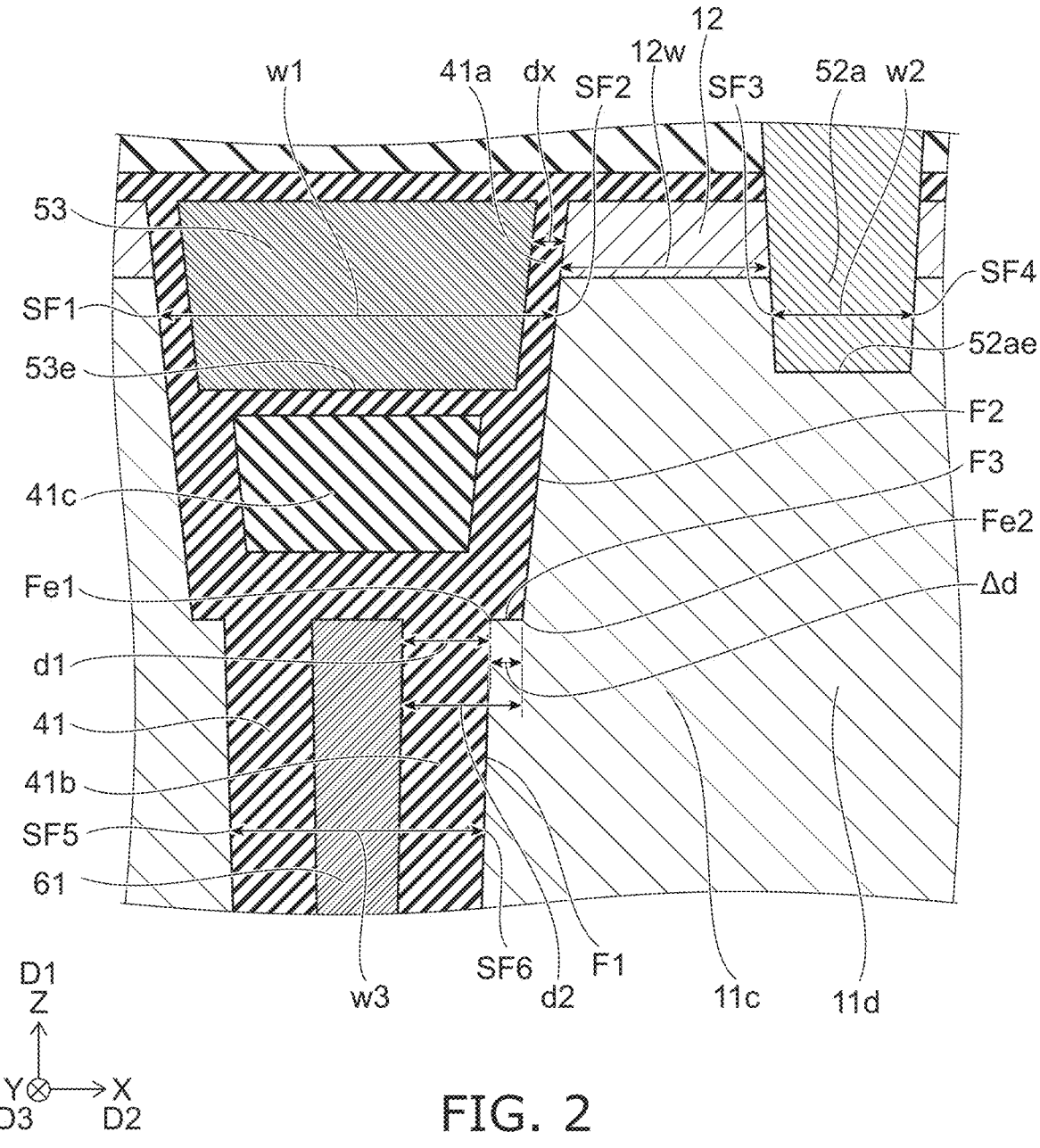
FIG. 2 is a schematic cross-sectional view illustrating a part of the semiconductor device according to the first embodiment.

FIG. 2 is a schematic cross-sectional view illustrating a part of the semiconductor device according to the first embodiment.

As shown in FIG. 1, a semiconductor device 110 according to the embodiment includes a first electrode 51, a second electrode 52, a third electrode 53, a semiconductor member 10, a first conductive member 61, and a first insulating member 41.

A direction from the first electrode 51 to the second electrode 52 is along a first direction D1. The first direction D1 is defined as a Z-axis direction. One direction perpendicular to the Z-axis direction is defined as an X-axis direction. A direction perpendicular to the Z-axis direction and the X-axis direction is defined as a Y-axis direction.

For example, the first electrode 51 includes a first electrode face 51*f*. The first electrode face 51*f* faces the semiconductor member 10. The first electrode face 51*f* is substantially parallel to the X-Y plane. The first direction D1 crosses the first electrode face 51*f*.

The second electrode 52 includes a first electrode portion 52*a* and a second electrode portion 52*b*. The second electrode portion 52*b* is connected to the first electrode portion 52*a*. The third electrode 53 is provided between the first electrode 51 and the second electrode portion 52*b*.

The semiconductor member 10 includes a first semiconductor region 11 and a second semiconductor region 12. The first semiconductor region 11 is of the first conductivity type. The first conductivity type is one of n-type and p-type. In this example, the first conductivity type is n-type. The semiconductor member 10 includes silicon, for example.

The first semiconductor region 11 includes a first partial region 11*a*, a second partial region 11*b*, a third partial region 11*c* and a fourth partial region 11*d*. The first partial region 11*a* is provided between the first electrode 51 and the third electrode 53 in the first direction D1. A second direction D2 from the first partial region 11*a* to the second partial region 11*b* crosses the first direction D1. The second direction D2 is, for example, the X-axis direction.

A position of the third partial region 11*c* in the second direction D2 is between a position of the first partial region 11*a* in the second direction D2 and a position of the second partial region 11*b* in the second direction D2. The fourth partial region 11*d* is provided between the second partial region 11*b* and the first electrode portion 52*a*. The boundaries among the first partial region 11*a*, the second partial region 11*b*, the third partial region 11*c*, and the fourth partial region 11*d* may be unclear.

The second semiconductor region 12 is of the first conductivity type. An impurity concentration of the first conductivity type in the second semiconductor region 12 is higher than an impurity concentration of the first conductivity type in the first semiconductor region 11. The first semiconductor region 11 is, for example, an n⁻ layer. The second semiconductor region 12 is an n layer or an n⁺ layer.

The second semiconductor region 12 is provided between the third electrode 53 and the first electrode portion 52*a* in the second direction D2. The second semiconductor region 12 is provided between the third partial region 11*c* and the second electrode portion 52*b* in the first direction D1.

The first conductive member 61 is provided between the first partial region 11*a* and the third electrode 53 in the first direction D1. A direction from the first conductive member 61 to the fourth partial region 11*d* is along the second direction D2.

The first conductive member 61 is electrically connected to the second electrode 52. Alternatively, the first conductive member 61 is configured to be electrically connected to the second electrode 52. For example, a first conductive member terminal 61T and a second electrode terminal 52T may be provided. The first conductive member terminal 61T and the second electrode terminal 52T may be electrically connected by a wiring 52L. The wiring 52L may be included in the semiconductor device 110. The wiring 52L may be provided separately from the semiconductor device 110. The first conductive member 61 and the third electrode 53 extend along a third direction D3. The third direction D3 crosses a plane including the first direction D1 and the second direction D2. The third direction D3 is, for example, the Y-axis direction.

The first insulating member 41 includes a first insulating region 41*a*, a second insulating region 41*b*, and a third insulating region 41*c*. The first insulating region 41*a* is provided between the third electrode 53 and the second semiconductor region 12. The second insulating region 41*b* is provided between the semiconductor member 10 and the first conductive member 61. At least a part of the third insulating region 41*c* is provided between the first conductive member 61 and the third electrode 53.

In the semiconductor device 110, current between the first electrode 51 and the second electrode 52 may be controlled by a potential of the third electrode 53. The potential of the third electrode 53 may be, for example, a potential based on a potential of the second electrode 52. The first electrode 51 functions, for example, as a drain electrode. The second electrode 52 functions, for example, as a source electrode. The third electrode 53 functions, for example, as a gate electrode. The semiconductor device 110 is, for example, a transistor.

The first conductive member 61 functions, for example, as a field plate. For example, electric field concentration is alleviated. Breakage of the first insulating member 41 and the like caused by the concentration of the electric field is suppressed. It becomes easy to obtain stable characteristics. It becomes easy to obtain high reliability.

As shown in FIGS. 1 and 2, in the embodiment, the second insulating region 41*b* includes the first face F1. The first face F1 faces the third partial region 11*c*. The third insulating region 41*c* includes a second face F2. The second face F2 faces the third partial region 11*c*. The first face F1 includes a first end Fe1. The first end Fe1 is the end of the first face F1 on a side of the second electrode 52 in the first direction D1. The second face F2 includes a second end Fe2. The second end Fe2 is the end of the second face F2 on a side of the first electrode 51 in the first direction D1.

For example, in a case where a direction from the first electrode 51 to the second electrode 52 is the "upward direction", the first end Fe1 is the upper end of the first face F1. The second end Fe2 is the lower end of the second face F2.

As shown in FIGS. 1 and 2, a second position of the second end Fe2 in the second direction D2 is different from a first position of the first end Fe1 in the second direction D2. A step 41*s* is provided between the first end Fe1 and the second end Fe2.

For example, as shown in FIG. 2, the third insulating region 41*c* further includes a third face F3. The third face F3 is provided between the first face F1 and the second face F2. The third face F3 is connected to the first face F1 and the second face F2. The third face F3 is non-parallel to the first face F1. The third face F3 is non-parallel to the second face F2.

By providing such a step 41*s*, charge balance can be adjusted. For example, a semiconductor device with stable characteristics can be provided.

As shown in FIG. 2, a distance along the second direction D2 between the first conductive member 61 and the first position is defined as a first distance d1. A distance along the second direction D2 between the first conductive member 61 and the second position is defined as a second distance d2. The first distance d1 is shorter than the second distance d2. The first face F1 recedes with respect to the second face F2. The second face F2 protrudes with respect to the first face F1.

As shown in FIG. 2, a distance along the second direction D2 between the first position and the second position is defined as a distance Δd. The distance Δd corresponds to the size of the step 41*s*. The distance Δd may be, for example, not less than 0.3 times and not more than to 2 times a thickness dx along the second direction D2 of the first insulating region 41*a*.

As shown in FIG. 1, the second semiconductor region 12 contacts the first semiconductor region 11. In the semiconductor device 110, the semiconductor region of the second conductivity type may not be provided. For example, the first electrode portion 52a makes Schottky contact with the semiconductor member 10. For example, the first electrode portion 52a contacts the second semiconductor region 12 and the fourth partial region 11d. The first electrode portion 52a includes, for example, at least one selected from the group consisting of Pt, Co, and Ni. The first electrode portion 52a includes, for example, a material with a relatively high work function. This provides a Schottky contact. The semiconductor device 110 is, for example, a Schottky contact type transistor. The height of the Schottky barrier can be controlled by the potential of the third electrode 53. The current flowing between the first electrode 51 and the second electrode 52 can be controlled by the potential of the third electrode 53.

As shown in FIG. 2, the first electrode portion 52a includes a first electrode portion end 52ae. The first electrode portion end 52ae is the end on a side of the first electrode 51 in the first direction D1. The first electrode portion end 52ae is the lower end of the first electrode portion 52a. The third electrode 53 includes a third electrode end 53e. The third electrode end 53e is the end on a side of the first electrode 51 in the first direction D1. The third electrode end 53e is the lower end of the third electrode 53. The third electrode end 53e is preferably below the first electrode portion end 52ae.

For example, a position of the third electrode end 53e in the first direction D1 is between a position of the first electrode 51 in the first direction D1 and a position of the first electrode portion end 52ae in the first direction D1. Thereby, it becomes easy to suppress deterioration of the gate-drain capacitance Qgd.

As shown in FIG. 2, a width of the third electrode 53 along the second direction D2 is wider than a width of the first conductive member 61 along the second direction D2.

As shown in FIG. 2, the first semiconductor region 11 includes a first semiconductor face SF1, a second semiconductor face SF2, a third semiconductor face SF3, and a fourth semiconductor face SF4. The third electrode 53 is provided between the first semiconductor face SF1 and the second semiconductor face SF2 in the second direction D2. A part of the first insulating member 41 is provided between the first semiconductor face SF1 and the third electrode 53. Another part of the first insulating member 41 is provided between the third electrode 53 and the second semiconductor face SF2.

The first electrode portion 52a is provided between the third semiconductor face SF3 and the fourth semiconductor face SF4 in the second direction D2. A distance along the second direction D2 between the first semiconductor face SF1 and the second semiconductor face SF2 is defined as a first width w1. A distance along the second direction D2 between the third semiconductor face SF3 and the fourth semiconductor face SF4 is defined as a second width w2. The first width w1 is greater than the second width w2.

As shown in FIG. 2, the first semiconductor region 11 may include the first semiconductor face SF1, the second semiconductor face SF2, a fifth semiconductor face SF5, and a sixth semiconductor face SF6. The first conductive member 61 is provided between the fifth semiconductor face SF5 and the sixth semiconductor face SF6 in the second direction D2. A part of the first insulating member 41 is provided between the fifth semiconductor face SF5 and the first conductive member 61. Another part of the first insulating member 41 is provided between the first conductive member 61 and the sixth semiconductor face SF6. A distance along the second direction D2 between the fifth semiconductor face SF5 and the sixth semiconductor face SF6 is defined as a third width w3. The first width w1 (the distance along the second direction D2 between the first semiconductor face SF1 and the second semiconductor face SF2) is greater than the third width w3.

As shown in FIG. 1, a width of the first conductive member 61 along the second direction D2 changes continuously or is constant in the first direction D1. Concentration of the electric field can be further suppressed as compared with a case where the first conductive member 61 changes stepwise.

As shown in FIG. 2, a width of the second semiconductor region 12 along the second direction D2 is defined as a second semiconductor region width 12w. In the embodiment, the second semiconductor region width 12w is, for example, not less than 25 nm and not more than 50 nm.

As shown in FIG. 1, the semiconductor device 110 may further include a second insulating member 42. At least a part of the second insulating member 42 is provided between the third electrode 53 and the second electrode portion 52b.

Second Embodiment

The second embodiment relates to a method for manufacturing a semiconductor device.

FIGS. 3A to 3D, FIGS. 4A to 4D, FIGS. 5A to 5D, FIGS. 6A to 6D, FIGS. 7A to 7D, FIG. 8A and FIG. 8B are schematic cross-sectional views illustrating the method for manufacturing a semiconductor device according to the second embodiment.

Figure 3A:
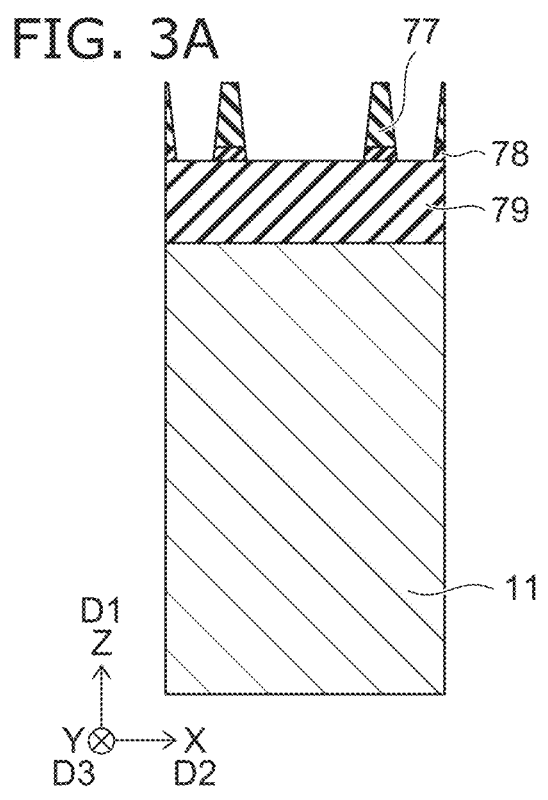
FIGS. 3A to 3D are schematic cross-sectional views illustrating the method for manufacturing a semiconductor device according to a second embodiment.

As shown in FIG. 3A, the first semiconductor region 11 of the first conductivity type is prepared. The first semiconductor region 11 is, for example, a silicon layer. A mask film 79 is formed on the first semiconductor region 11. The mask film 79 may be, for example, a $SiN_x$ film. The upper face of the mask film 79 extends along the X-Y plane. A direction perpendicular to the upper face of the mask film 79 is defined as a first direction D1.

A resist film 77 having a desired pattern shape is formed on the mask film 79. A carbon film 78 may be provided between the mask film 79 and the resist film 77. The carbon film 78 may be provided or omitted as required. Using the resist film 77 as a mask, the carbon film 78 is processed. The mask film 79 is processed using the carbon film 78 as a mask. As a result, the mask film 79 is provided with a desired pattern shape.

Figure 3B:
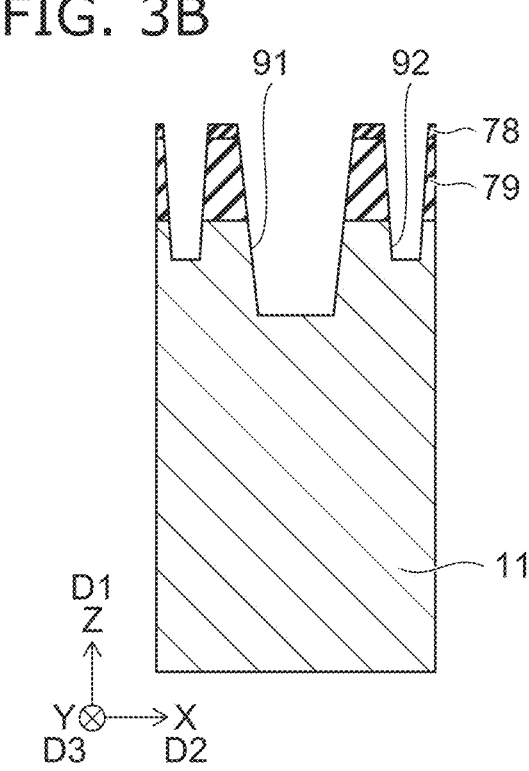

As shown in FIG. 3B, using the mask film 79 as a mask, a first trench 91 and a second trench 92 are made in the first semiconductor region 11 at once. For example, these trenches are made by RIE (Reactive Ion Etching). The width of the first trench 91 is wider than the width of the second trench 92. These widths are based on the pattern shape of the mask film 79. The first semiconductor region 11 is removed more efficiently in the first trench 91 being wide than in the second trench 92 being narrow. Thereby, the depth of the first trench 91 becomes deeper than the depth of the second trench 92. A direction from the first trench 91 to the second trench 92 corresponds to the second direction D2. These trenches are along the third direction D3. The width is, for example, the length along the second direction D2. The depth is the length along the first direction D1.

Figure 3C:
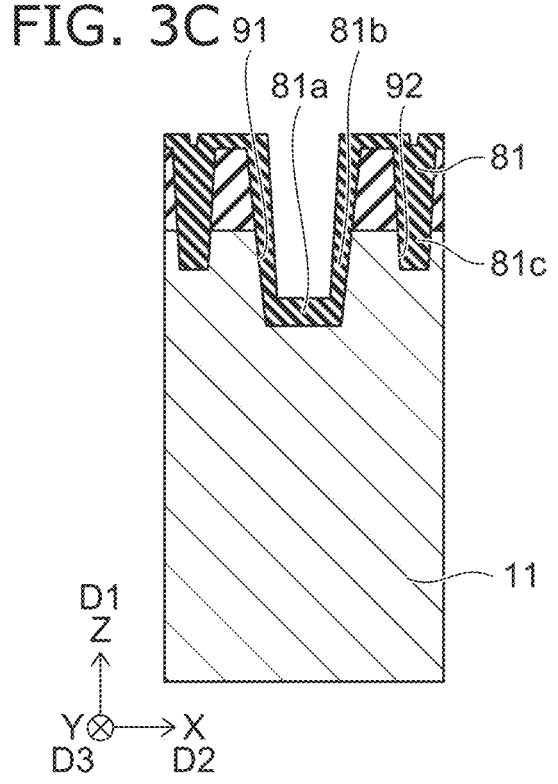

As shown in FIG. 3C, a first insulating film 81 is formed inside the first trench 91 and inside the second trench 92. The first insulating film 81 may be $SiN_x$, for example. The first insulating film 81 includes a first insulating portion 81$a$, a second insulating portion 81$b$ and a third insulating portion 81$c$. The first insulating portion 81$a$ is provided at the bottom of the first trench 91. The second insulating portion 81$b$ is provided on the sidewall of the first trench 91. A space is left in the first trench 91. The third insulating portion 81$c$ is provided in the second trench 92. The second trench 92 is substantially closed by the third insulating portion 81$c$.

Figure 3D:
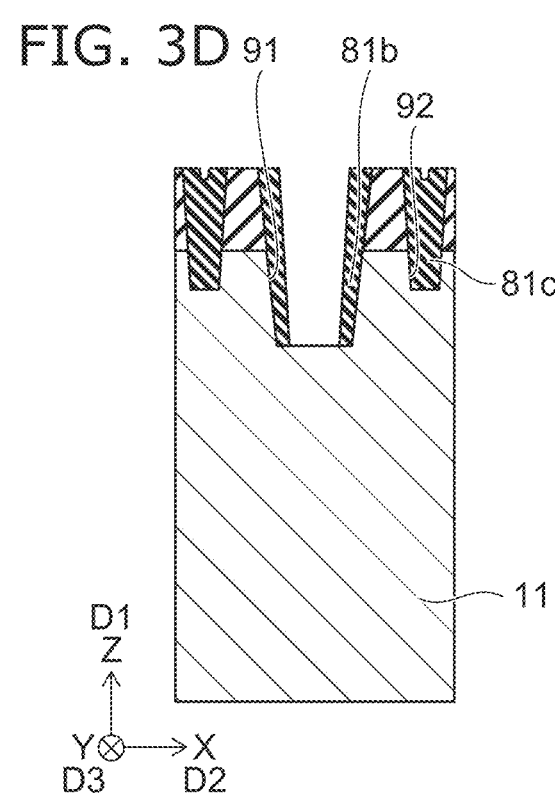

As shown in FIG. 3D, the first insulating portion 81$a$ is removed to expose a part of the first semiconductor region 11. The removal is performed, for example, by RIE. At this time, at least a part of the second insulating portion 81$b$ remains. The third insulating portion 81$c$ also remains.

Figure 4A:
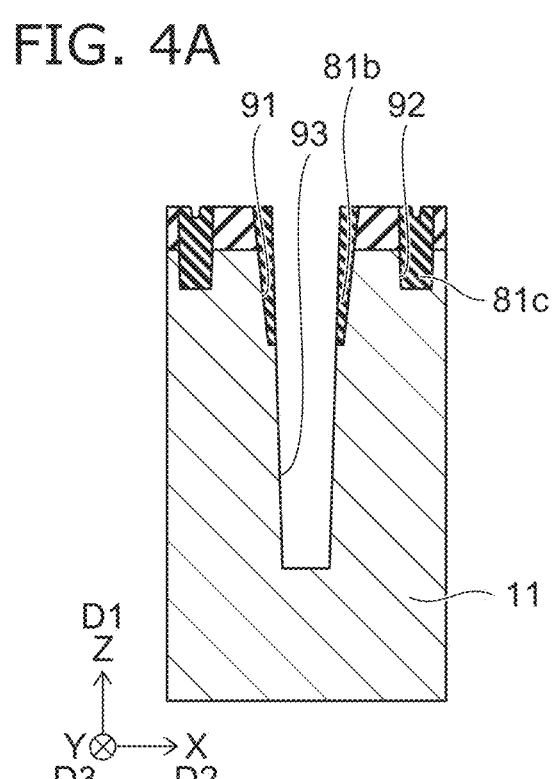
FIGS. 4A to 4D are schematic cross-sectional views illustrating the method for manufacturing the semiconductor device according to the second embodiment.

As shown in FIG. 4A, the exposed portion of the first semiconductor region 11 is removed to make a third trench 93. The removal is performed, for example, by RIE.

Figure 4B:
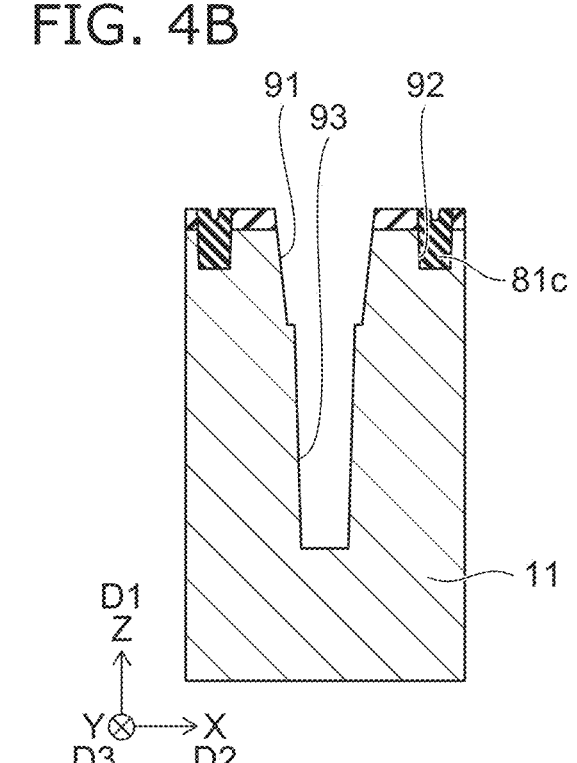

As shown in FIG. 4B, after the making the third trench 93, the second insulating portion 81$b$ being remained is removed. As shown in FIG. 4B, a step is formed between the side wall of the first trench 91 and the side wall of the third trench 93. The size of the step is based on the thickness of the second insulating portion 81$b$ being remained. Thus, the step is formed between the side face of the first trench 91 and the side face of the third trench 93 by removing the second insulating portion 81$b$.

Figure 4C:
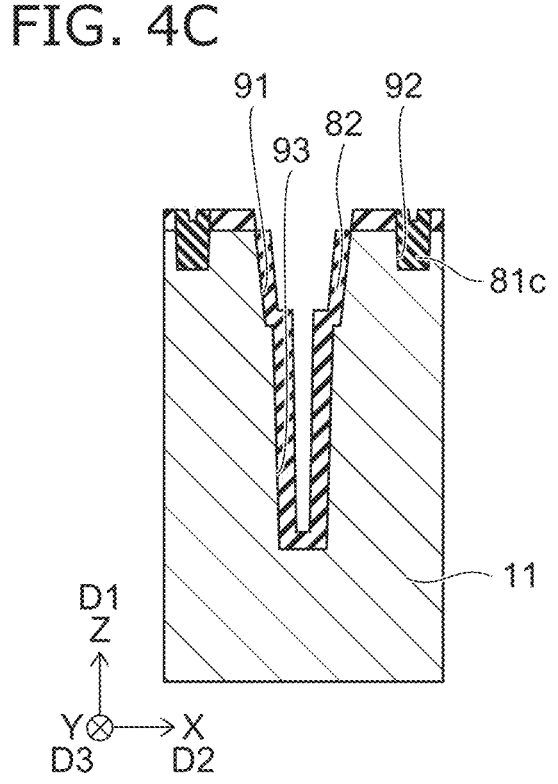

As shown in FIG. 4C, a second insulating film 82 is formed inside the first trench 91 and the third trench 93. The second insulating film 82 may be, for example, $SiO_2$.

Figure 4D:
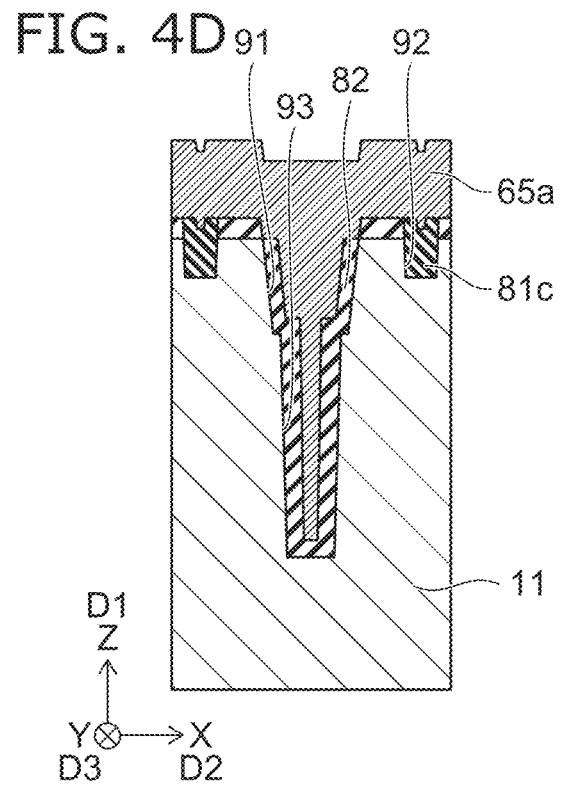

As shown in FIG. 4D, a first conductive material 65$a$ is introduced inside the third trench 93. The first conductive material 65$a$ may be, for example, polysilicon. The first conductive material 65$a$ may also be formed in portions other than the interior of the trench.

As shown in FIG. 5A, a part of the first conductive material 65$a$ other than the part inside the third trench 93 is removed. Thereby, the first conductive member 61 is formed. Thus, the first conductive member 61 is formed by introducing the first conductive material 65$a$ into the interior of the third trench 93. A space is remained inside the first trench 91.

As will be described below, the third electrode 53 is formed above the first conductive member 61 after the forming the first conductive member 61 described above. Further, after removing the third insulating portion 81$c$, a second conductive material 65$b$ is introduced into the second trench 92 to form the first electrode portion 52$a$. Thereby, the semiconductor device 110 can be formed.

In the embodiment, the third electrode 53 may be formed as follows.

As shown in FIG. 5A, after the forming the first conductive member 61, the first conductive material 65$a$ existing in the remaining space of the first trench 91 is removed.

As shown in FIG. 5B, a third insulating film 83 is embedded on the first conductive member 61 and in the remaining space of the first trench 91. The third insulating film 83 may be, for example, an $SiO_2$ film formed by CVD (Chemical Vapor Deposition). The third insulating film 83 may be, for example, a BPSG (Boro-Phospho Silicate Glass) film. For example, the etching rate of the third insulating film 83 in a wet etching may be substantially the same as the etching rate of $SiO_2$ in the wet etching.

As shown in FIG. 5C, the third insulating film 83 is planarized. If the third insulating film 83 is a BPSG film, the planarization process may be omitted.

As shown in FIG. 5D, the third insulating film 83 is wet-etched to leave a part of the third insulating film 83 positioned at the bottom of the first trench 91 while removing other part of the third insulating film 83. In this etching, the upper portion of the second insulating film 82 (the portion near the opening of the first trench 91) is removed. Thus, a part of the third insulating film 83 inside the first trench 91 is removed and another part of the third insulating film 83 is left inside the first trench 91.

Figure 6A:
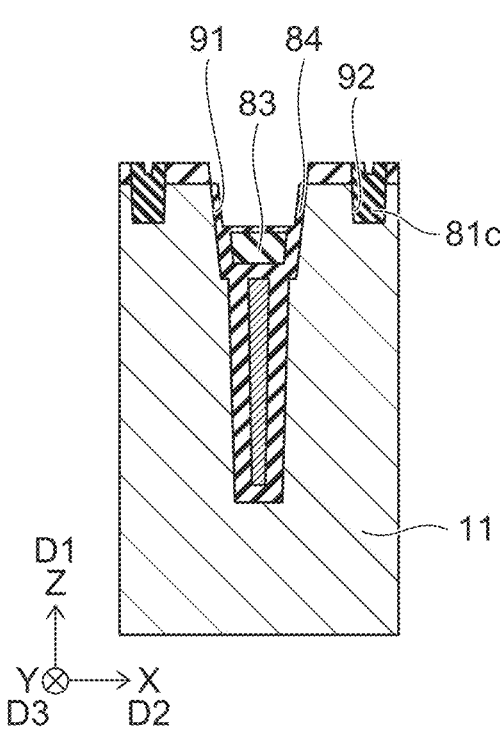
FIGS. 6A to 6D are schematic cross-sectional views illustrating the method for manufacturing the semiconductor device according to the second embodiment.

As shown in FIG. 6A, a fourth insulating film 84 is formed on the side wall of the first trench 91. The fourth insulating film 84 is formed by thermal oxidation of silicon, for example. The fourth insulating film 84 becomes, for example, the first insulating region 41$a$.

Figure 6B:
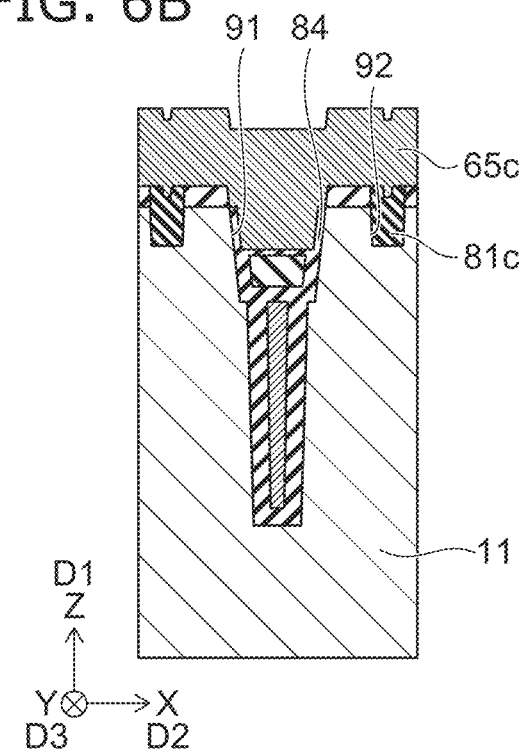

As shown in FIG. 6B, a third conductive material 65$c$ is introduced into the remaining space of the first trench 91 after the fourth insulating film 84 is formed. The third conductive material 65$c$ may be polysilicon, for example.

Figure 6C:
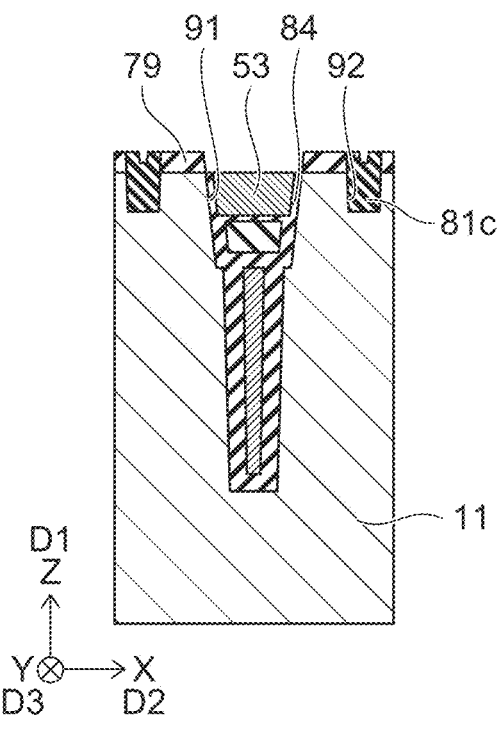

As shown in FIG. 6C, unnecessary part of the third conductive material 65$c$ are removed. The third electrode 53 is formed by the third conductive material 65$c$ being remained. In the state of FIG. 6C, the mask film 79 exists on the first semiconductor region 11.

Figure 6D:
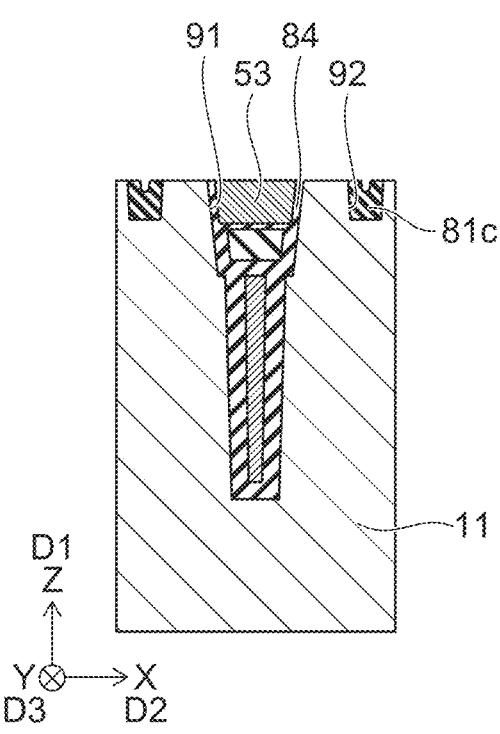

As shown in FIG. 6D the mask film 79 is removed.

Figure 7A:
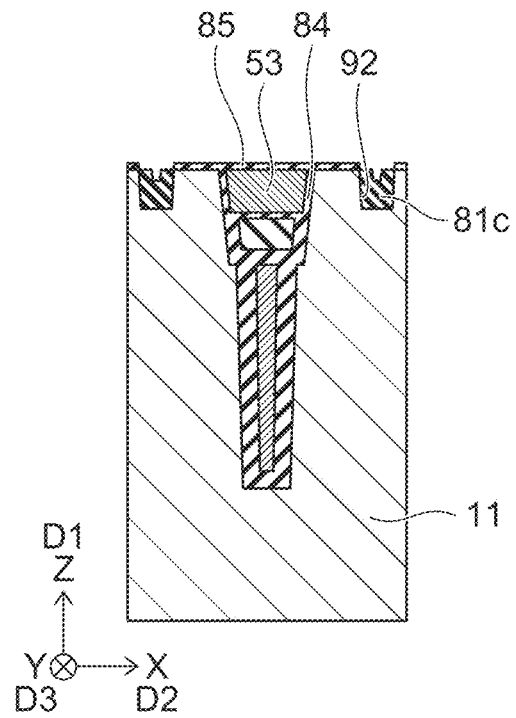
FIGS. 7A to 7D are schematic cross-sectional views illustrating the method for manufacturing the semiconductor device according to the second embodiment.

As shown in FIG. 7A, for example, a fifth insulating film 85 is formed from the upper part of the third electrode 53 and the upper part of the first semiconductor region. The fifth insulating film 85 is formed by, for example, thermal oxidation.

Figure 7B:
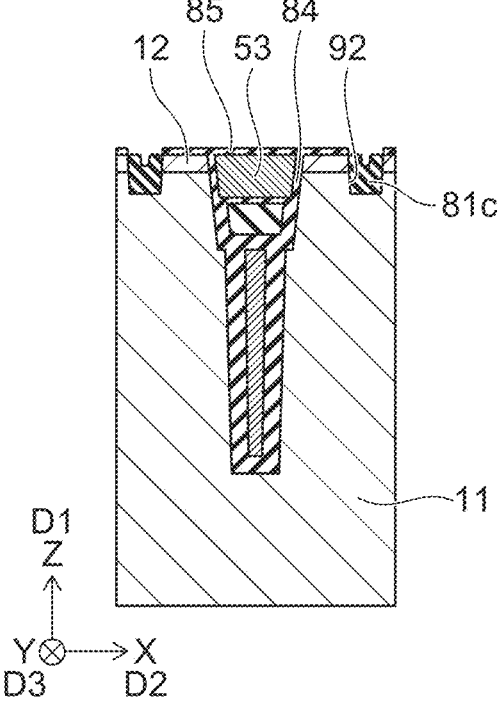

As shown in FIG. 7B, the second semiconductor region 12 is formed by introducing a first conductivity type impurity into the surface portion of the first semiconductor region 11 through the fifth insulating film 85.

After that, in the second trench 92, the first electrode portion 52$a$ is formed. The first electrode portion 52$a$ may be formed, for example, as follows.

Figure 7C:
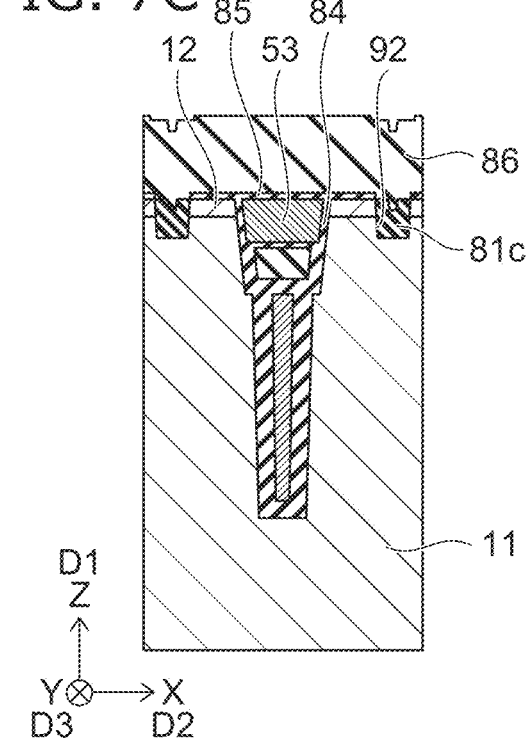

As shown in FIG. 7C, a sixth insulating film 86 is formed on the fifth insulating film 85. The sixth insulating film 86 may be, for example, an $SiO_2$ film. The sixth insulating film 86 forms at least a part of the second insulating member 42.

Figure 7D:
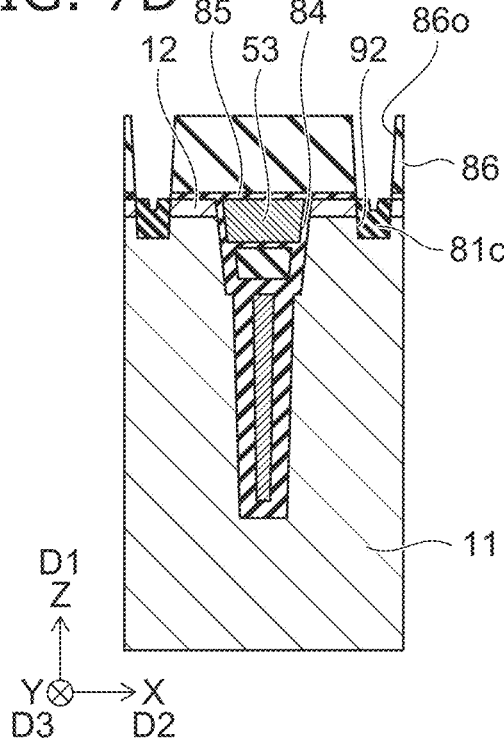

As shown in FIG. 7D, an opening 86$o$ is made in the sixth insulating film 86. The third insulating portion 81$c$ existing in the second trench 92 is exposed at the opening 86$o$.

Figure 8A:
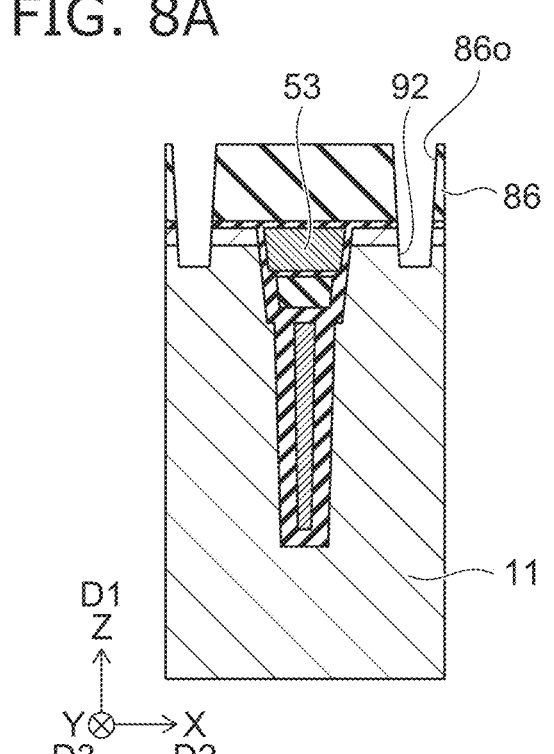
FIGS. 8A and 8B are schematic cross-sectional views illustrating the method for manufacturing the semiconductor device according to the second embodiment.

As shown in FIG. 8A, the third insulating portion 81$c$ is removed. By removing the third insulating portion 81$c$, the bottom and sidewall of the second trench 92 are exposed.

Figure 8B:
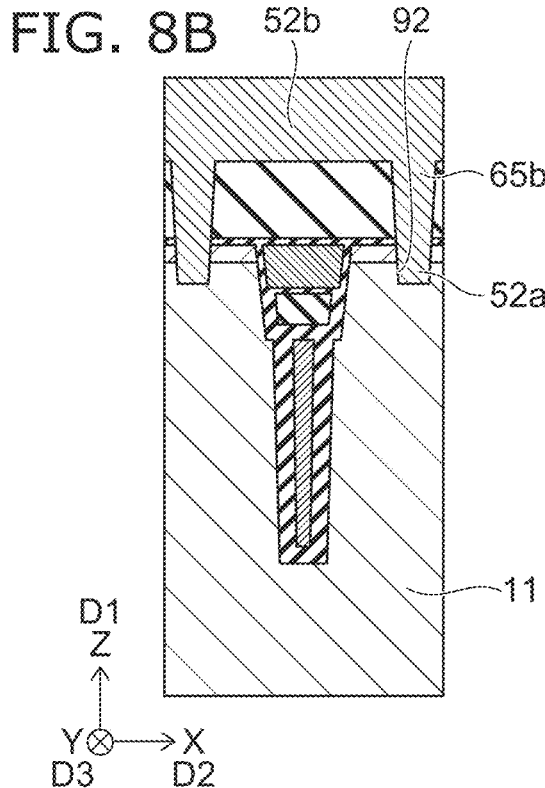

As shown in FIG. 8B, the second conductive material 65$b$ is introduced into the space in the second trench 92. The second conductive material 65$b$ being introduced forms the first electrode portion 52$a$. Another part of the second conductive material 65$b$ forms the second electrode portion 52$b$. Thereby, the second electrode 52 is formed.

After that, the first electrode 51 is formed on the lower surface of the first semiconductor region 11. Thus, the semiconductor device 110 is obtained.

In the method of manufacturing the semiconductor device according to the embodiment, the first trench 91 and the second trench 92 are made in one step with one mask. If these trenches are made in separate steps, they will be misaligned. In the embodiment, misalignment can be suppressed.

In the embodiment, fine trenches can be made with high accuracy. For example, positional deviation in the third electrode 53 and the first electrode portion 52$a$ can be suppressed. As a result, for example, a decrease in carrier discharge efficiency due to the misalignment is suppressed. For example, electrical shorts are suppressed. For example, more stable characteristics can be obtained. Reliability can be further improved.

The embodiments may include the following configurations (for example, technical proposals).

Configuration 1

A semiconductor device, comprising:
a first electrode;
a second electrode, a direction from the first electrode to the second electrode being along a first direction, the second electrode including a first electrode portion and a second electrode portion connected to the first electrode portion;
a third electrode provided between the first electrode and the second electrode portion;
a semiconductor member, the semiconductor member including
    a first semiconductor region of a first conductive type, the first semiconductor region including a first partial region, a second partial region, a third partial region and a fourth partial region, the first partial region being provided between the first electrode and the third electrode in the first direction, a second direction from the first partial region to the second partial region crossing the first direction, a position of the third partial region in the second direction being between a position of the first partial region in the second direction and a position of the second partial region in the second direction, the fourth partial region being provided between the second partial region and the first electrode, and
    a second semiconductor region of the first conductive type, an impurity concentration of the first conductive type in the second semiconductor region being higher than an impurity concentration of the first conductive type in the first semiconductor region, the second semiconductor region being provided between the third electrode and the first electrode portion in the second direction, the second semiconductor region being provided between the third partial region and the second electrode portion in the first direction;
a first conductive member provided between the first partial region and the third electrode in the first direction, a direction from the first conductive member to the fourth partial region being along the second direction, the first conductive member being electrically connected to the second electrode or being configured to be electrically connected to the second electrode; and
a first insulating member including a first insulating region, a second insulating region, and a third insulating region, the first insulating region being provided between the third electrode and the second semiconductor region, the second insulating region being provided between the semiconductor member and the first conductive member, at least a part of the third insulating region being provided between the first conductive member and the third electrode, the second insulating region including a first face facing the third partial region, the third insulating region including a second face facing the third partial region, the first face including a first end on a side of the first electrode in the first direction, the second face including a second end on a side of the second electrode in the first direction, a second position of the second end in the second direction being different from a first position of the first end in the second direction.

Configuration 2

The semiconductor device according to Configuration 1, wherein
a first distance along the second direction between the first conductive member and the first position is shorter than a second distance along the second direction between the first conductive member and the second position.

Configuration 3

The semiconductor device according to Configuration 1 or 2, wherein
a distance between the first position and the second position along the second direction is not less than 0.3 times and not more than 2 times a thickness of the first insulating region along the second direction.

Configuration 4

The semiconductor device according to any one of Configurations 1-3, wherein
a step is provided between the first face and the second face.

Configuration 5

The semiconductor device according to any one of Configurations 1-4, wherein
the third insulating region further includes a third face, and
the third face is provided between the first face and the second face and connected to the first face and the second face, and the third face is non-parallel to the first face and non-parallel to the second face.

Configuration 6

The semiconductor device according to any one of Configurations 1-5, wherein
the second semiconductor region is in contact with the first semiconductor region.

Configuration 7

The semiconductor device according to any one of Configurations 1-6, wherein
the first electrode portion is in Schottky contact with the semiconductor member.

Configuration 8

The semiconductor device according to any one of Configurations 1-7, wherein
the first electrode portion is in contact with the second semiconductor region and the fourth portion region, and
the first electrode portion includes at least one selected from the group consisting of Pt, Co, and Ni.

Configuration 9

The semiconductor device according to any one of Configurations 1-8, wherein
the first electrode portion includes a first electrode portion end on a side of the first electrode in the first direction,

the third electrode includes a third electrode end on a side
of the first electrode in the first direction,
a position of the third electrode end in the first direction
is between a position of the first electrode in the first
direction and a position of the first electrode portion
end in the first direction.

Configuration 10

The semiconductor device according to any one of Con-
figurations 1-9, wherein
a width of the third electrode along the second direction
is wider than a width of the first conductive member
along the second direction.

Configuration 11

The semiconductor device according to any one of Con-
figurations 1-10, wherein
the first semiconductor region includes a first semicon-
ductor face, a second semiconductor face, a third
semiconductor face, and a fourth semiconductor face,
the third electrode is located between the first semicon-
ductor face and the second semiconductor face in the
second direction,
a part of the first insulating member is located between the
first semiconductor face and the third electrode,
another part of the first insulating member is located
between the third electrode and the second semicon-
ductor face,
the first electrode portion is located between the third
semiconductor face and the fourth semiconductor face
in the second direction, and
a first width along the second direction between the first
semiconductor face and the second semiconductor face
is larger than a second width along the second direction
between the third semiconductor face and the fourth
semiconductor face.

Configuration 12

The semiconductor device according to any one of Con-
figurations 1-10, wherein
the first semiconductor region includes a first semicon-
ductor face, a second semiconductor face, a fifth semi-
conductor face, and a sixth semiconductor face,
the third electrode is located between the first semicon-
ductor face and the second semiconductor face in the
second direction,
a part of the first insulating member is located between the
first semiconductor face and the third electrode,
another part of the first insulating member is located
between the third electrode and the second semicon-
ductor face,
the first conductive member is located between the fifth
semiconductor face and the sixth semiconductor face in
the second direction,
further another part of the first insulating member is
located between the fifth semiconductor face and the
first conductive member,
further another part of the first insulating member is
located between the first conductive member and the
sixth semiconductor face, and
a first width along the second direction between the first
semiconductor face and the second semiconductor face is larger than a third width along the second direction
between the fifth semiconductor face and the sixth
semiconductor face.

Configuration 13

The semiconductor device according to any one of Con-
figurations 1-12, wherein
a width of the first conductive member along the second
direction continuously changes or is constant in the first
direction.

Configuration 14

The semiconductor device according to any one of Con-
figurations 1-13, wherein
a width of the second semiconductor region along the
second direction is not less than 25 nm and not more
than 50 nm.

Configuration 15

The semiconductor device according to any one of Con-
figurations 1-14, further comprising:
a second insulating member,
at least a part of the second insulating member being
provided between the third electrode and the second
electrode portion.

Configuration 16

A method for manufacturing a semiconductor device, the
method comprising:
making a first trench and a second trench at one time in
a first semiconductor region of a first conductive type,
a width of the first trench being wider than a width of
the second trench, a depth of the first trench being
deeper than a depth of the second trench;
forming a first insulating film in the first trench and the
second trench, the first insulating film including a first
insulating portion, a second insulating portion and a
third insulating portion, the first insulating portion
being provided at a bottom of the first trench, the
second insulating portion being provided on a sidewall
of the first trench, a space being left in the first trench,
the second trench being substantially closed by the
third insulating portion;
removing the first insulating portion to expose a part of
the first semiconductor region;
removing the part of the first semiconductor region being
exposed to form a third trench;
removing the second insulating portion after the forming
the third trench;
forming a second insulating film inside the first trench and
the third trench;
introducing a first conductive material into the third
trench to form a first conductive member;
forming a third electrode above the first conductive mem-
ber after the forming the first conductive member; and
introducing a second conductive material into the second
trench to form a first electrode portion after the remov-
ing the third insulating portion.

Configuration 17

The method for manufacturing the semiconductor device
according to Configuration 16, wherein the forming the third electrode includes
    removing a portion of the first conductive material
        existing in a remaining space of the first trench after
        the forming the first conductive member;
    embedding a third insulating film on the first conduc-
        tive member and in the remaining space in the first
        trench;
    removing a part of the third insulating film inside the
        first trench, another part of the third insulating film
        being left inside the first trench;
    forming a fourth insulating film on a side wall of the
        first trench; and
    introducing a third conductive material into the remain-
        ing space of the first trench after the forming the
        fourth insulating film to form the third electrode.

Configuration 18

The method for manufacturing the semiconductor device
according to Configuration 17, further comprising:
    forming a fifth insulating film from an upper part of the
        third electrode and an upper part of the first semicon-
        ductor region; and
    introducing a first conductive impurity into a surface
        portion of the first semiconductor region through the
        fifth insulating film to form the second semiconductor
        region.

Configuration 19

The method for manufacturing the semiconductor device
according to Configuration 18, wherein
    the forming the first electrode portion includes
        removing the third insulating portion after the forming
            the second semiconductor region, and
        introducing the second conductive material into the
            second trench formed by the removing the third
            insulating portion.

Configuration 20

The method for manufacturing the semiconductor device
according to any one of Configurations 16-19, wherein
    a step is formed between a side face of the first trench and
        a side face of the third trench by removing the second
        insulating portion.

According to the embodiments, it is possible to provide a
semiconductor device with stable characteristics and a
method of manufacturing the same.

In the specification of the application, "perpendicular"
and "parallel" refer to not only strictly perpendicular and
strictly parallel but also include, for example, the fluctuation
due to manufacturing processes, etc. It is sufficient to be
substantially perpendicular and substantially parallel.

Hereinabove, exemplary embodiments of the invention
are described with reference to specific examples. However,
the embodiments of the invention are not limited to these
specific examples. For example, one skilled in the art may
similarly practice the invention by appropriately selecting
specific configurations of components included in semicon-
ductor devices sensors such as electrodes, semiconductor
regions, conductive members, insulating members, etc.,
from known art. Such practice is included in the scope of the
invention to the extent that similar effects thereto are
obtained.

Further, any two or more components of the specific
examples may be combined within the extent of technical feasibility and are included in the scope of the invention to
the extent that the purport of the invention is included.

Moreover, all semiconductor devices practicable by an
appropriate design modification by one skilled in the art
based on the semiconductor devices described above as
embodiments of the invention also are within the scope of
the invention to the extent that the purport of the invention
is included.

Various other variations and modifications can be con-
ceived by those skilled in the art within the spirit of the
invention, and it is understood that such variations and
modifications are also encompassed within the scope of the
invention.

While certain embodiments have been described, these
embodiments have been presented by way of example only,
and are not intended to limit the scope of the inventions.
Indeed, the novel embodiments described herein may be
embodied in a variety of other forms; furthermore, various
omissions, substitutions and changes in the form of the
embodiments described herein may be made without depart-
ing from the spirit of the inventions. The accompanying
claims and their equivalents are intended to cover such
forms or modifications as would fall within the scope and
spirit of the invention.

What is claimed is:

1. A semiconductor device, comprising:
    a first electrode;
    a second electrode, a direction from the first electrode to
        the second electrode being along a first direction, the
        second electrode including a first electrode portion and
        a second electrode portion connected to the first elec-
        trode portion;
    a third electrode provided between the first electrode and
        the second electrode portion;
    a semiconductor member, the semiconductor member
        including
        a first semiconductor region of a first conductive type,
            the first semiconductor region including a first partial
            region, a second partial region, a third partial region
            and a fourth partial region, the first partial region
            being provided between the first electrode and the
            third electrode in the first direction, a second direc-
            tion from the first partial region to the second partial
            region crossing the first direction, a position of the
            third partial region in the second direction being
            between a position of the first partial region in the
            second direction and a position of the second partial
            region in the second direction, the fourth partial
            region being provided between the second partial
            region and the first electrode portion, and
        a second semiconductor region of the first conductive
            type, an impurity concentration of the first conduc-
            tive type in the second semiconductor region being
            higher than an impurity concentration of the first
            conductive type in the first semiconductor region, the
            second semiconductor region being provided
            between the third electrode and the first electrode
            portion in the second direction, the second semicon-
            ductor region being provided between the third par-
            tial region and the second electrode portion in the
            first direction;
    a first conductive member provided between the first
        partial region and the third electrode in the first direc-
        tion, a direction from the first conductive member to the
        fourth partial region being along the second direction,
        the first conductive member being electrically connected to the second electrode or being configured to be electrically connected to the second electrode; and a first insulating member including a first insulating region, a second insulating region, and a third insulating region, the first insulating region being provided between the third electrode and the second semiconductor region, the second insulating region being provided between the semiconductor member and the first conductive member, at least a part of the third insulating region being provided between the first conductive member and the third electrode, the second insulating region including a first face facing the third partial region, the third insulating region including a second face facing the third partial region, the first face including a first end on a side of the second electrode in the first direction, the second face including a second end on a side of the first electrode in the first direction, a second position of the second end in the second direction being different from a first position of the first end in the second direction.

2. The device according to claim 1, wherein
a first distance along the second direction between the first conductive member and the first position of the first end is shorter than a second distance along the second direction between the first conductive member and the second position of the second end.

3. The device according to claim 1, wherein
a distance between the first position of the first end and the second position of the second end along the second direction is not less than 0.3 times and not more than 2 times a thickness of the first insulating region along the second direction.

4. The device according to claim 1, wherein
a step is provided between the first face and the second face.

5. The device according to claim 1, wherein
the third insulating region further includes a third face, and
the third face is provided between the first face and the second face and connected to the first face and the second face, and the third face is non-parallel to the first face and non-parallel to the second face.

6. The device according to claim 1, wherein
the second semiconductor region is in contact with the first semiconductor region.

7. The device according to claim 1, wherein
the first electrode portion is in Schottky contact with the semiconductor member.

8. The device according to claim 1, wherein
the first electrode portion is in contact with the second semiconductor region and the fourth portion region, and
the first electrode portion includes at least one selected from the group consisting of Pt, Co, and Ni.

9. The device according to claim 1, wherein
the first electrode portion includes a first electrode portion end on a side of the first electrode in the first direction,
the third electrode includes a third electrode end on a side of the first electrode in the first direction,
a position of the third electrode end in the first direction is between a position of the first electrode in the first direction and a position of the first electrode portion end in the first direction.

10. The device according to claim 1, wherein
a width of the third electrode along the second direction is wider than a width of the first conductive member along the second direction.

11. The device according to claim 1, wherein
the first semiconductor region includes a first semiconductor face, a second semiconductor face, a third semiconductor face, and a fourth semiconductor face,
the third electrode is located between the first semiconductor face and the second semiconductor face in the second direction,
a part of the first insulating member is located between the first semiconductor face and the third electrode,
another part of the first insulating member is located between the third electrode and the second semiconductor face,
the first electrode portion is located between the third semiconductor face and the fourth semiconductor face in the second direction, and
a first width along the second direction between the first semiconductor face and the second semiconductor face is larger than a second width along the second direction between the third semiconductor face and the fourth semiconductor face.

12. The device according to claim 1, wherein
the first semiconductor region includes a first semiconductor face, a second semiconductor face, a fifth semiconductor face, and a sixth semiconductor face,
the third electrode is located between the first semiconductor face and the second semiconductor face in the second direction,
a part of the first insulating member is located between the first semiconductor face and the third electrode,
another part of the first insulating member is located between the third electrode and the second semiconductor face,
the first conductive member is located between the fifth semiconductor face and the sixth semiconductor face in the second direction,
further another part of the first insulating member is located between the fifth semiconductor face and the first conductive member,
further another part of the first insulating member is located between the first conductive member and the sixth semiconductor face, and
a first width along the second direction between the first semiconductor face and the second semiconductor face is larger than a third width along the second direction between the fifth semiconductor face and the sixth semiconductor face.

13. The device according to claim 1, wherein
a width of the first conductive member along the second direction continuously changes or is constant in the first direction.

14. The device according to claim 1, wherein
a width of the second semiconductor region along the second direction is not less than 25 nm and not more than 50 nm.

15. The device according to claim 1, further comprising:
a second insulating member, at least a part of the second insulating member being provided between the third electrode and the second electrode portion.

* * * * *